(12) United States Patent
Hu

(10) Patent No.: US 12,310,220 B2
(45) Date of Patent: May 20, 2025

(54) DISPLAY DEVICE AND DISPLAY TERMINAL

(71) Applicant: Wuhan China Star Optoelectronics Semiconductor Display Technology Co., Ltd., Hubei (CN)

(72) Inventor: Xiaojing Hu, Hubei (CN)

(73) Assignee: Wuhan China Star Optoelectronics Semiconductor Display Technology Co., Ltd., Wuhan (CN)

( * ) Notice: Subject to any disclaimer, the term of this patent is extended or adjusted under 35 U.S.C. 154(b) by 0 days.

(21) Appl. No.: 17/622,877

(22) PCT Filed: Dec. 17, 2021

(86) PCT No.: PCT/CN2021/139257
§ 371 (c)(1),
(2) Date: Dec. 27, 2021

(87) PCT Pub. No.: WO2023/103049
PCT Pub. Date: Jun. 15, 2023

(65) Prior Publication Data
US 2024/0040916 A1    Feb. 1, 2024

(30) Foreign Application Priority Data
Dec. 9, 2021   (CN) .......................... 202111501236.X

(51) Int. Cl.
*H10K 59/80*     (2023.01)
*G09F 9/30*      (2006.01)
*H10K 59/131*    (2023.01)
*H10K 102/00*    (2023.01)

(52) U.S. Cl.
CPC ......... *H10K 59/8792* (2023.02); *G09F 9/301* (2013.01); *H10K 59/131* (2023.02); *H10K 2102/311* (2023.02)

(58) Field of Classification Search
None
See application file for complete search history.

(56) References Cited

U.S. PATENT DOCUMENTS

2024/0032211 A1*   1/2024   Zhou ........................ H05K 5/02

FOREIGN PATENT DOCUMENTS

| CN | 106405964 | 2/2017 |
|----|-----------|--------|
| CN | 107134459 | 9/2017 |
| CN | 107945683 | 4/2018 |
| CN | 111239873 | 6/2020 |
| CN | 213025182 | 4/2021 |
| CN | 112967606 | 6/2021 |

(Continued)

OTHER PUBLICATIONS

CN113658511A Machine Translation via EPO (Year: 2021).*

*Primary Examiner* — Laura C Powers

(57) ABSTRACT

Embodiments of the present application provide a display device and a display terminal. By arranging a back plate layer with a black light-shielding function, the back plate layer and a buffer and light-shielding layer are combined as one. The back plate includes a first back plate, and the first back plate is directly attached to a rigid supporting layer. The buffer and light-shielding layer is not required. As such, a thickness of the display device can be reduced, so that the display device is lighter and thinner.

17 Claims, 7 Drawing Sheets

(56) References Cited

FOREIGN PATENT DOCUMENTS

| | | |
|---|---|---|
| CN | 113658511 | 11/2021 |
| CN | 113707019 | 11/2021 |
| CN | 113707031 | 11/2021 |
| JP | 2009-169349 | 7/2009 |
| JP | 2015-030127 | 2/2015 |
| WO | WO 2020/093478 | 5/2020 |
| WO | WO 202/1102781 | 6/2021 |

\* cited by examiner

DISPLAY DEVICE AND DISPLAY TERMINAL

RELATED APPLICATIONS

This application is a National Phase of PCT Patent Application No. PCT/CN2021/139257 having International filing date of Dec. 17, 2021, which claims the benefit of priority of Chinese Patent Application No. 202111501236.X filed on Dec. 9, 2021. The contents of the above applications are all incorporated by reference as if fully set forth herein in their entirety.

FIELD AND BACKGROUND OF THE INVENTION

The present disclosure relates to the display technology field, and more particularly to a display device and a display terminal.

Organic light-emitting display devices (OLED) are widely used in life. An organic light-emitting display device includes an organic light-emitting display panel body. In order to realize a narrow frame design of organic light-emitting display device, the organic light-emitting display panel body is usually divided into a flat plate part, a bending part, and a pad (land) part. Usually, the flat plate part is a part where an image is displayed, the pad part is a part where a driving chip and a circuit board are bonded or electrically connected, and the bending part is a part where the pad part is arranged at a back side of the flat plate during bending. Multiple supporting layers are required to be provided at the back side of the flat plate part of the organic light-emitting display panel body, so that the organic light-emitting display device has excellent performance, for example, has a flat surface to display an excellent image to have good reliability. In the prior art, a first back plate (BP1, a part of the back plate layer, which is usually made of polyimide or PET), a buffer and light-shielding layer (usually black foam material), a rigid supporting layer (an SUS layer, which is usually stainless steel material), and a second back plate (BP2, a part of the back plate layer, which is usually made of polyimide or PET) are sequentially arranged at the back side of the organic light emitting display panel body. A function of the first back plate and the second back plate is to support the display panel body. A function of the buffer layer is to buffer external force and impact. A function of the rigid supporting layer is to maintain the flat surface of the flat plate part.

However, in the prior art, the arrangement of the multiple supporting layers causes the problem that the display device has a thicker thickness.

SUMMARY OF THE INVENTION

Embodiments of the present disclosure provide a display device and a display terminal capable of solving the problem that the display device in the prior art has a thicker thickness due to the arrangement of multiple supporting layers.

An embodiment of the present disclosure provides a display device including:
- a display panel body including a flat plate part, a bending part, and a pad part, wherein the bending part is located between the flat plate part and the pad part; and when the bending part is bent, the pad part is located at a back side of the flat plate part;
- a back plate layer including a first back plate, wherein the first back plate is arranged at the back side of the flat plate part; and
- a rigid supporting layer arranged between the first back plate and the pad part;
- wherein the back plate layer is made of black light-shielding material, and the first back plate is directly attached to the rigid supporting layer.

Optionally, in some embodiments of the present disclosure, the back plate layer further includes a second back plate, and the second back plate is arranged at a side of the pad part toward the flat plate part.

Optionally, in some embodiments of the present disclosure, the display device further includes a first gel layer and a second gel layer, wherein the second gel layer includes a first sub-gel member, an elastic modulus of the second gel layer is greater than an elastic modulus of the first gel layer, and the second gel layer is arranged on a surface of the display panel body;
- the first gel layer is arranged at an outer side of the bending part, the first back plate includes a first edge toward the bending part, the rigid supporting layer includes a second edge toward the bending part, and an orthographic projection of the first sub-gel member on the display panel body covers an orthographic projection of the first edge or the second edge on the display panel body; and
- wherein the rigid supporting layer is directly attached to the pad part.

Optionally, in some embodiments of the present disclosure, the display device further includes a first gel layer and a second gel layer, wherein the second gel layer includes a first sub-gel member, a thickness of the first sub-gel member is greater than a thickness of the first gel layer, an elastic modulus of the second gel layer is equal to an elastic modulus of the first gel layer, and the second gel layer is arranged on a surface of the display panel body;
- the first gel layer is arranged at an outer side of the bending part, the first back plate includes a first edge toward the bending part, the rigid supporting layer includes a second edge toward the bending part, and an orthographic projection of the first sub-gel member on the display panel body covers an orthographic projection of the first edge or the second edge on the display panel body; and
- wherein the rigid supporting layer is directly attached to the pad part.

Optionally, in some embodiments of the present disclosure, the back plate layer includes at least one of polyimide and ethylene terephthalate, and the at least one of the polyimide and the ethylene terephthalate is doped with black material.

Optionally, in some embodiments of the present disclosure, the second gel layer further includes a second sub-gel member; and
- the orthographic projection of the first sub-gel member on the display panel body covers the orthographic projection of the first edge on the display panel body, and the orthographic projection of the second sub-gel member on the display panel body covers the orthographic projection of the second edge on the display panel body.

Optionally, in some embodiments of the present disclosure, a thickness of the first sub-gel member and a thickness of the second sub-gel member are both greater than a thickness of the first gel layer.

Optionally, in some embodiments of the present disclosure, each of the first sub-gel member and the second sub-gel member is arranged on a surface of the display panel body away from the first back plate.

Optionally, in some embodiments of the present disclosure, the display device further includes a polarizer, wherein the polarizer is arranged at a display side of the flat plate part of the display panel body, and a distance between the first sub-gel member and an edge of the polarizer is greater than 0 μm and less than or equal to 200 μm.

Optionally, in some embodiments of the present disclosure, the display device further includes a driving chip and a pad terminal arranged on a surface of the pad part away from the rigid supporting layer, the driving chip is electrically connected to the pad terminal, and the second sub-gel member contacts the pad terminal.

Optionally, in some embodiments of the present disclosure, the first sub-gel member and the second sub-gel member are arranged on a surface of the display panel body close to the first back plate, the first sub-gel member contacts a side edge of the first back plate, and the second sub-gel member contacts a side edge of the rigid supporting layer.

Optionally, in some embodiments of the present disclosure, the second gel layer further includes a second sub-gel member, and a thickness of the second sub-gel member is greater than the thickness of the first gel layer; and
the orthographic projection of the first sub-gel member on the display panel body covers the orthographic projection of the first edge on the display panel body, and an orthographic projection of the second sub-gel member on the display panel body covers the orthographic projection of the second edge on the display panel body.

Optionally, in some embodiments of the present disclosure, the first sub-gel member and the second sub-gel member are connected to each other to be an integral structure.

Optionally, in some embodiments of the present disclosure, the thickness of the first sub-gel member gradually decreases toward the first gel layer, and the thickness of the second sub-gel member gradually decreases toward the first gel layer.

Optionally, in some embodiments of the present disclosure, the display device further includes a polarizer, wherein the polarizer is arranged at a display side of the flat plate part of the display panel body, and a distance between the first sub-gel member and an edge of the polarizer is greater than 0 μm and less than or equal to 200 μm.

Optionally, in some embodiments of the present disclosure, the display device further includes a driving chip and a pad terminal arranged on a surface of the pad part away from the rigid supporting layer, the driving chip is electrically connected to the pad terminal, and the second sub-gel member contacts the pad terminal.

Correspondingly, an embodiment of the present disclosure further provides a display terminal including a terminal body and a display device. The terminal body and the display device are combined as one. The display device includes:
- a display panel body including a flat plate part, a bending part, and a pad part, wherein the bending part is located between the flat plate part and the pad part; and when the bending part is bent, the pad part is located at a back side of the flat plate part;
- a back plate layer including a first back plate, wherein the first back plate is arranged at the back side of the flat plate part; and
- a rigid supporting layer arranged between the first back plate and the pad part;
- wherein the back plate layer is made of black light-shielding material, and the first back plate is directly attached to the rigid supporting layer.

Optionally, in some embodiments of the present disclosure, the back plate layer further includes a second back plate, and the second back plate is arranged at a side of the pad part toward the flat plate part.

Optionally, in some embodiments of the present disclosure, the display terminal further includes a first gel layer and a second gel layer, wherein the second gel layer includes a first sub-gel member, an elastic modulus of the second gel layer is greater than an elastic modulus of the first gel layer, and the second gel layer is arranged on a surface of the display panel body;
the first gel layer is arranged at an outer side of the bending part, the first back plate includes a first edge toward the bending part, the rigid supporting layer includes a second edge toward the bending part, and an orthographic projection of the first sub-gel member on the display panel body covers an orthographic projection of the first edge or the second edge on the display panel body; and
wherein the rigid supporting layer is directly attached to the pad part.

Optionally, in some embodiments of the present disclosure, the display terminal further includes a first gel layer and a second gel layer, wherein the second gel layer includes a first sub-gel member, a thickness of the first sub-gel member is greater than a thickness of the first gel layer, an elastic modulus of the second gel layer is equal to an elastic modulus of the first gel layer, and the second gel layer is arranged on a surface of the display panel body;
the first gel layer is arranged at an outer side of the bending part, the first back plate includes a first edge toward the bending part, the rigid supporting layer includes a second edge toward the bending part, and an orthographic projection of the first sub-gel member on the display panel body covers an orthographic projection of the first edge or the second edge on the display panel body; and
wherein the rigid supporting layer is directly attached to the pad part.

The embodiments of the present disclosure provide a display device and a display terminal. By arranging the back plate layer with a black light-shielding function, the back plate layer and the buffer and light-shielding layer are combined as one, and the buffer and light-shielding layer is not required. As such, the thickness of the display device can be reduced, so that the display device is lighter and thinner.

BRIEF DESCRIPTION OF THE SEVERAL
VIEWS OF THE DRAWINGS

To describe the technical solutions of the embodiments of the present disclosure more clearly, the following briefly introduces the accompanying drawings required for describing the embodiments. Apparently, the accompanying drawings in the following description show only some embodiments of the present disclosure, and those skilled in the art may still derive other drawings from these accompanying drawings without creative efforts.

DESCRIPTION OF SPECIFIC EMBODIMENTS OF THE INVENTION

Figure 1:
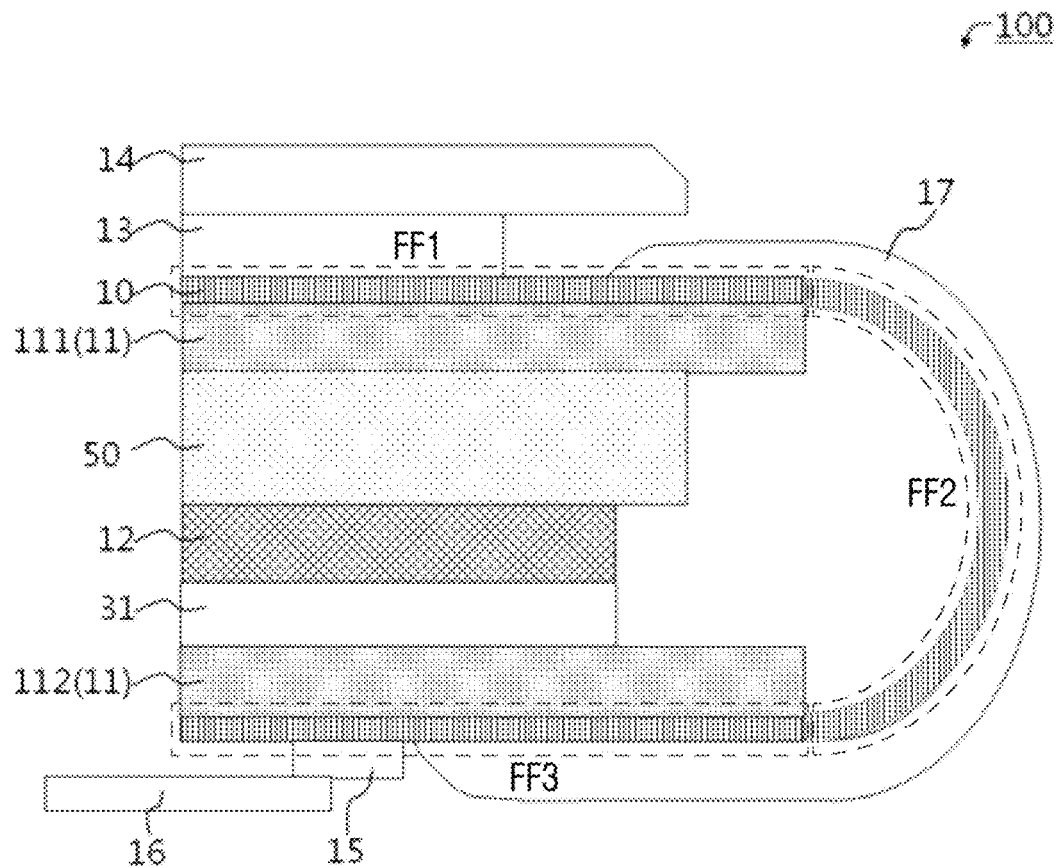
FIG. 1 illustrates a schematic structure diagram of a display device 100 in the prior art which is bent.

The following clearly describes the technical solutions in the embodiments of the present disclosure with reference to the accompanying drawings in the embodiments of the present disclosure. The described embodiments are some rather than all of the embodiments of the present disclosure. All other embodiments obtained by those skilled in the art based on the embodiments of the present disclosure without creative efforts shall fall within the protection scope of the present disclosure. Furthermore, it should be understood that specific implementations described herein are only used to illustrate and explain the present disclosure, and are not used to limit the present disclosure. In the present disclosure, if no explanation is made to the contrary, used orientation words, such as "upper" and "lower", generally refer to upper and lower directions of a device in an actual use or a working state, and specifically refer to drawing directions in the drawings. Words "inner" and "outer" refer to an outline of a device.

Embodiments of the present disclosure provide a display device and a display terminal. The display device includes: a display panel body including a flat plate part, a bending part, and a pad part, wherein the bending part is located between the flat plate part and the pad part, and the pad part is located at a back side of the flat plate part when the bending part is bent; a back plate layer including a first back plate, wherein the first back plate is arranged at the back side of the flat plate part; and a rigid supporting layer arranged between the first back plate and the pad part; wherein the back plate layer is black light-shielding material, and the first back plate is directly attached to the rigid supporting layer.

Embodiments of the present disclosure provide a display device and a display terminal which are respectively described in detail below. It should be noted that the order of description in the following embodiments is not meant to limit the preferred order of the embodiments.

Please refer to FIG. 1. FIG. 1 illustrates a schematic structure diagram of a display device 100 in the prior art.

In the prior art in FIG. 1, the display device 100 includes a display panel body 10. The display panel body 10 includes a flat plate part FF1, a bending part FF2, and a pad part FF3. As shown in FIGS. 1 to 12, the flat plate part FF1, the bending part FF2.

and the pad part FF3 of the display panel body 10 are illustrated in dashed blocks. The bending part FF2 is located between the flat plate part FF1 and the pad part FF3. When the bending part FF2 is bent, the pad part FF3 is located at a back side of the flat plate part FF1. A back plate layer 11 includes a first back plate 111 and a second back plate 112. The first back plate 111 is arranged at the back side of the flat plate part FF1, and the second back plate 112 is arranged at a side of the pad part FF3 toward the flat plate part FF1. A film structure between the flat plate part FF1 and the pad part FF3 sequentially includes: the first back plate 111, a buffer and light-shielding layer 50, a rigid supporting layer 12, a double-sided tape 31, and the second back plate 112.

The back plate layer 11 is usually made of polyimide or PET and configured to support the display panel body 10. The buffer and light-shielding layer is usually black foam material (Foam) and configured to buffer and shield light. The rigid supporting is usually stainless steel material (SUS) and configured to provide a flat surface for the display panel body 10.

In the prior art, a thickness of the buffer and light-shielding layer 50 is quite thick. Mostly, the foam has a thickness of 100-150 micrometers or even thicker to meet buffering and light-shielding functions. The large thickness causes problems, such as folding problems. Therefore, the arrangement of the multiple supporting layers in the conventional display device causes the problem that the thickness of the display device is thicker.

First Embodiment

Figure 2:
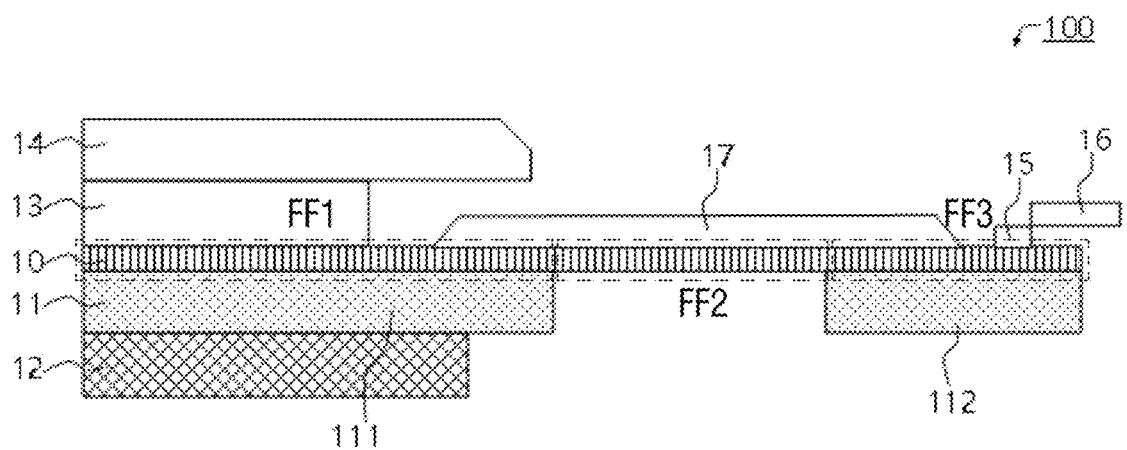
FIG. 2 illustrates a first schematic diagram of a display device provided by an embodiment of the present disclosure which is not bent.
Figure 3:
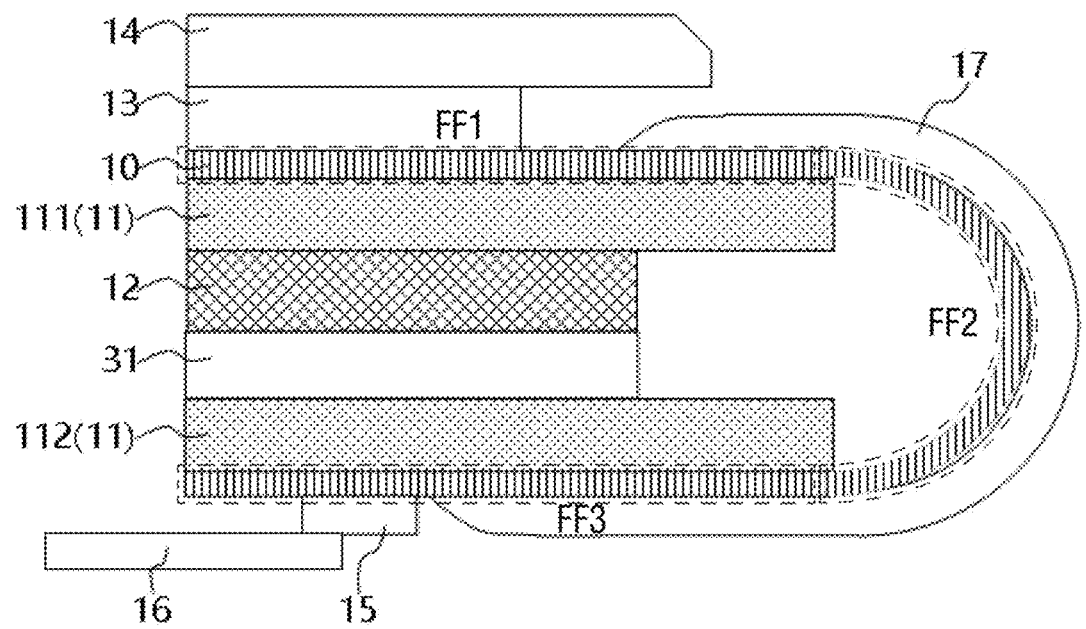
FIG. 3 illustrates a first schematic diagram of the display device provided by an embodiment of the present disclosure which is bent.

Please refer to FIG. 2 and FIG. 3. FIG. 2 illustrates a first schematic diagram of a display device 100 provided by an embodiment of the present disclosure which is not bent. FIG. 3 illustrates a first schematic diagram of the display device 100 provided by an embodiment of the present disclosure which is bent.

The embodiment of the present disclosure provides the display device 100. The display device 100 includes a display panel body 10, a back plate layer 11, and a rigid supporting layer 12. The display panel body 10 includes a flat plate part FF1, a bending part FF2, and a pad part FF3. The bending part FF2 is located between the flat plate part FF1 and the pad part FF2. When the bending part FF2 is bent, the pad part FF3 is located at a back side of the flat plate part FF1. The back plate layer 11 includes a first back plate 111 and a second back plate 112. The first back plate 111 is arranged at the back side of the flat plate part FF1, and the second back plate 112 is arranged at a side of the pad part FF3 toward the flat plate part FF1. The rigid supporting layer 12 is arranged between the first back plate 111 and the second back plate 112. The back plate layer 11 is black light-shielding material, and the first back plate 111 and the rigid supporting layer 12 are directly attached.

Specifically, when the bending part FF2 is bent, the pad part FF3 is located at the back side of the flat plate part FF1, so that a frame of the display device 100 can be reduced.

Specifically, the pad part FF3 includes a pad terminal 15, and the display device 100 is electrically connected to a structure, such as a driving chip or/and a circuit board through the pad terminal 15.

Specifically, when the bending part FF2 is bent, the display device 100 includes the pad part FF3, the second back plate 112, the rigid supporting layer 12, the first back plate 111, and the flat plate part FF1 which that are stacked. In some embodiments, the display device 100 can further include a polarizer 13 and a protective cover 14 (a cover glass (CG) used as a window). Specifically, the polarizer 13 is arranged at a display side of the display panel body 10, and the protective cover 14 is arranged at a side of the polarizer 13 away from the display panel body 10.

Specifically, the display side of the display panel body 10 or the flat plate part FF1 refers to a side where an image is displayed or viewed by human eyes.

Specifically, the back plate layer 11 includes the first back plate 111 and the second back plate 112. The first back plate 111 is arranged at the back side of the flat plate part FF1, and the second back plate 112 is arranged at the side of the pad part FF3 toward the flat plate part FF1. The back plate layer can be patterned and attached to the back side of the display panel body 10.

Specifically, as shown in FIG. 2, when the bending part FF2 is not bent, the first back plate 111 is arranged at the back side of the flat plate part FF1, and the second back plate 112 is arranged at the back side of the pad part FF3. That is, the first back plate 111 and the second back plate 112 are arranged at the same side of the display panel body 10.

Specifically, as shown in FIG. 3, when the bending part FF2 is bent, the back plate layer 11 includes the first back plate 111 and the second back plate 112. The first back plate 111 is arranged at the back side of the flat plate part FF1, and the second back plate 112 is arranged at the side of the pad part FF3 toward the flat plate part FF1.

Specifically, as shown in FIG. 3, when the bending part FF2 is bent, the rigid supporting layer 12 is arranged between the first back plate 111 and the second back plate 112. As shown in FIG. 2, when the bending part FF2 is not bent, the rigid supporting layer 12 is arranged at a side of the first back plate 111 away from the flat plate part FF1.

Specifically, the rigid supporting layer can include stainless steel (SUS).

Specifically, the back plate layer 11 is made of black light-shielding material. More specifically, the first back plate 111 is made of black light-shielding material which can prevent ambient light at the back side of the display panel body 10 from passing through the display panel body 10.

Specifically, the back side of the display panel body 10 or the flat plate part FF1 refers to a side where an image is not displayed or a side away from the display side.

Specifically, as shown in FIG. 3, the first back plate 111 is directly attached to the rigid supporting layer 12. The buffer and light-shielding layer 50 is no longer arranged between the first back plate 111 and the rigid supporting layer 12. Accordingly, a thickness of the display device 100 can be reduced significantly. This is beneficial for bending the bending of the display device 100.

Specifically, compared FIG. 1 with FIG. 3, by arranging the back plate layer 11 which is black light-shielding material, the back plate layer 11 can replace the back plate layer and the buffer and light-shielding layer (usually black foam) in the prior art. The back plate 11 has buffering effect, and it is made of black light-shielding material. Accordingly, the back plate layer 11 can have the buffering and light-shielding functions, so that the buffer and light-shielding layer 50 is not required. The back plate layer and the buffer and light-shielding layer are combined as one, and the buffer and light-shielding layer is not required. As such, the thickness of the display device can be reduced, so that the display device is lighter and thinner.

In some embodiments, the black light-shielding material includes at least one of polyimide and ethylene terephthalate, and the at least one of the polyimide and the ethylene terephthalate is doped with black material.

Specifically, each of the polyimide (PI) and the ethylene terephthalate (PET) is transparent material. The black material, such as black particles, is doped in the at least one of the polyimide and the ethylene terephthalate. This can make the at least one of the polyimide (PI) and the ethylene terephthalate (PET) further have black light-shielding effect.

Specifically, the black material can be carbon powder.

Specifically, in some embodiments, the display device 100 further includes a first gel layer 17. The first gel layer 17 is arranged at an outer side of the bending part to protect the bending part FF2.

In the embodiment of the present disclosure, the back plate layer and the buffer and light-shielding layer are combined as one in the prior art by arranging the back plate layer with the black light-shielding function. As such, the thickness of the display device can be reduced, so that the display device is lighter and thinner.

Second Embodiment

The present embodiment is the same as or similar to the above-mentioned embodiment except that a second gel layer 18 is arranged and the second back plate 112 is removed.

Figure 4:
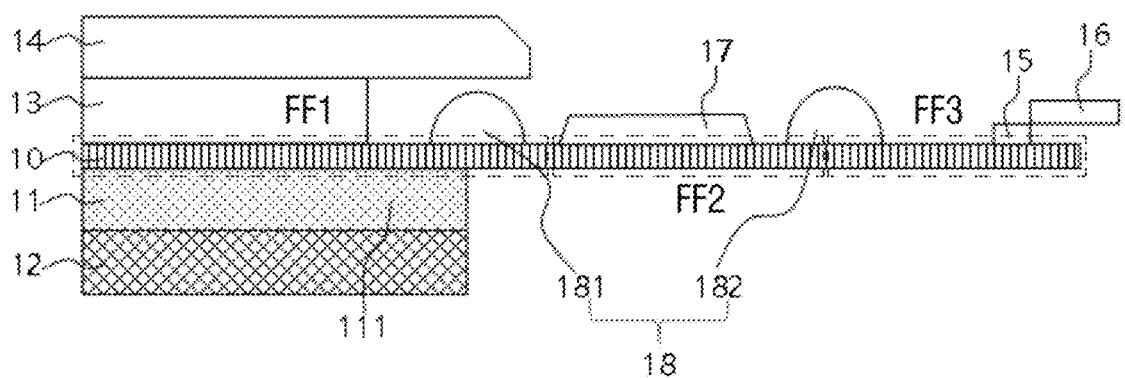
FIG. 4 illustrates a second schematic diagram of a display device provided by an embodiment of the present disclosure which is not bent.
Figure 5:
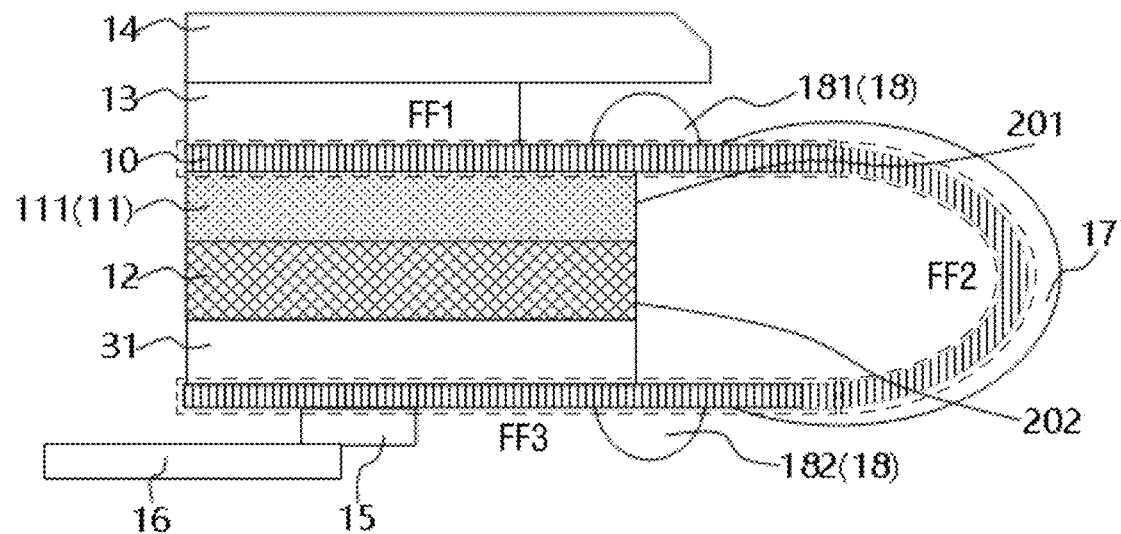
FIG. 5 illustrates a second schematic diagram of a display device provided by an embodiment of the present disclosure which is bent.
Figure 6:
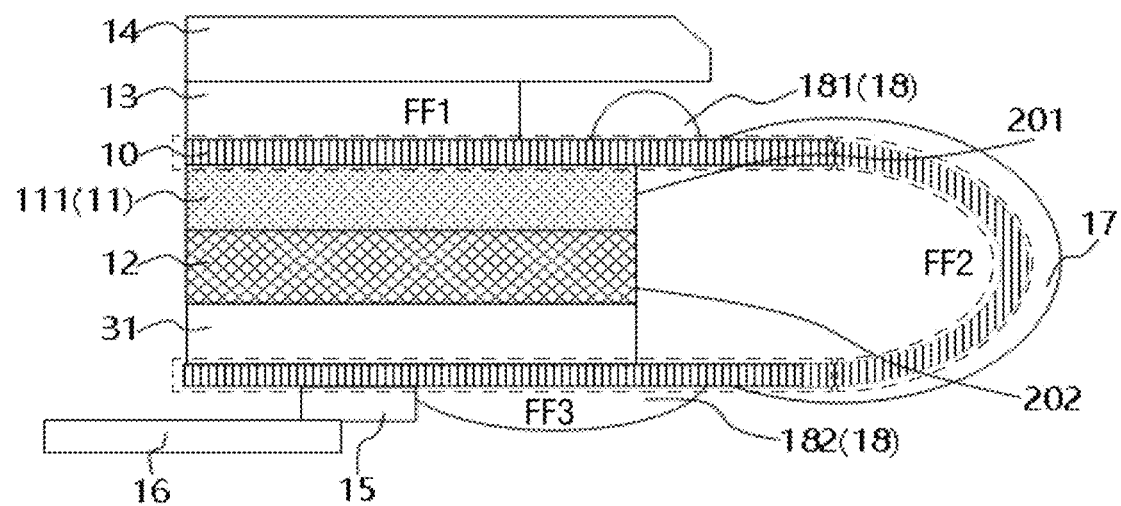
FIG. 6 illustrates a third schematic diagram of a display device provided by an embodiment of the present disclosure which is bent.
Figure 7:
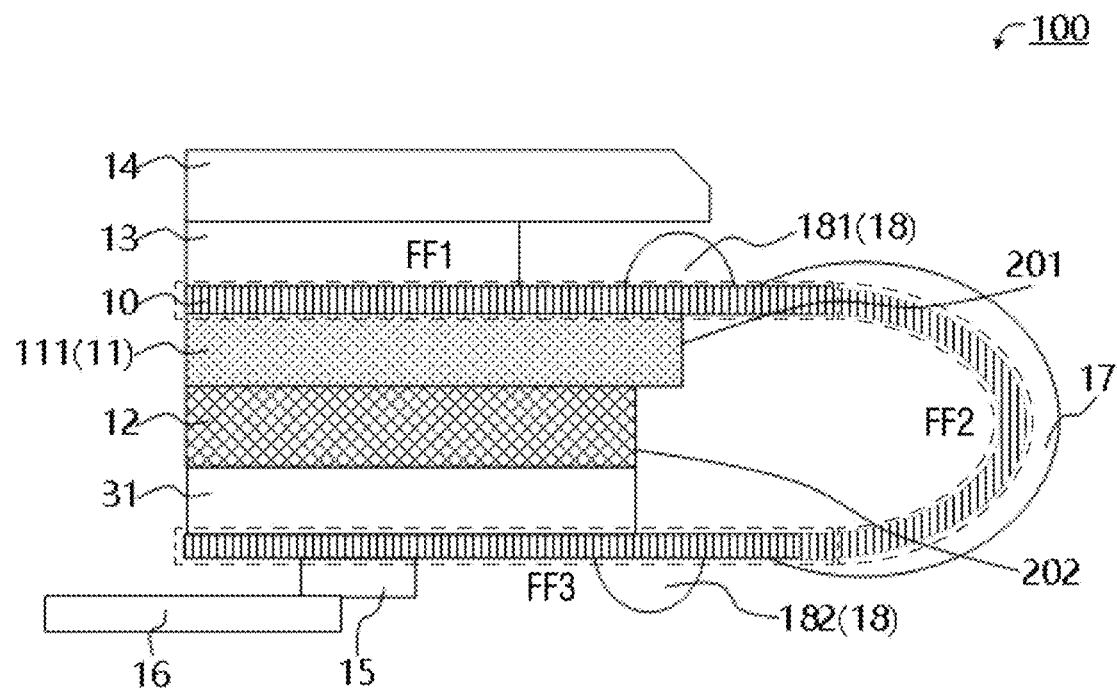
FIG. 7 illustrates a fourth schematic diagram of a display device provided by an embodiment of the present disclosure which is bent.
Figure 8:
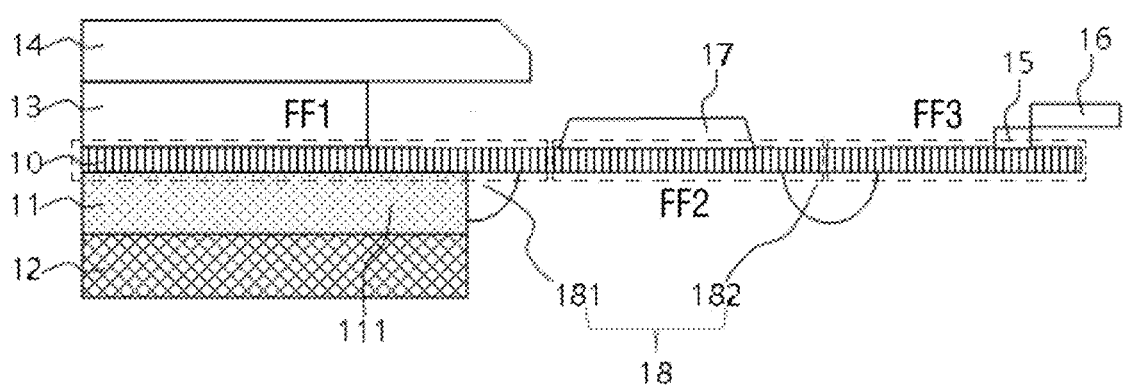
FIG. 8 illustrates a third schematic diagram of a display device provided by an embodiment of the present disclosure which is not bent.
Figure 9:
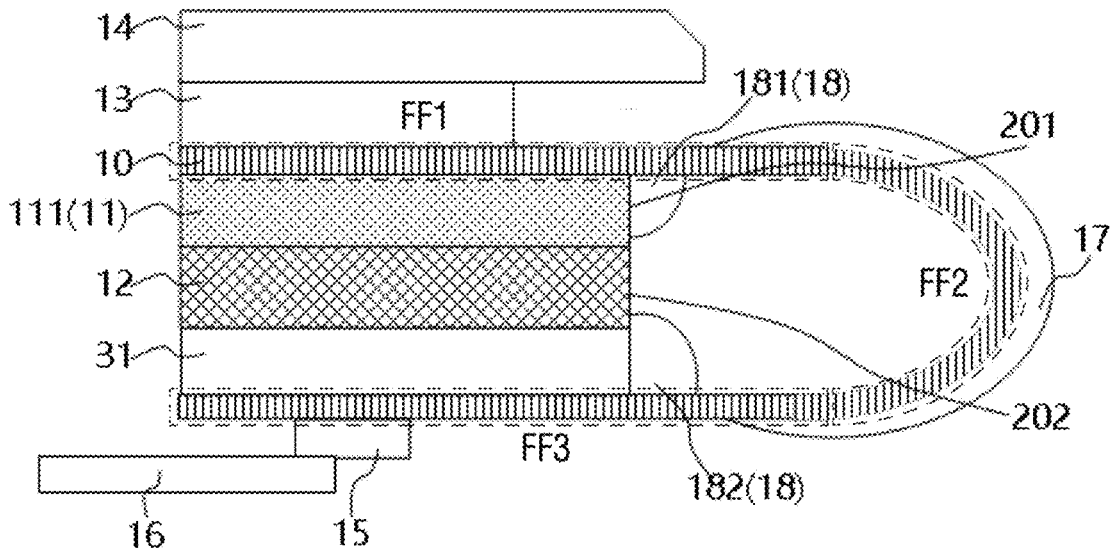
FIG. 9 illustrates a fifth schematic diagram of a display device provided by an embodiment of the present disclosure which is bent.

Please refer to FIG. 4, FIG. 5, FIG. 6, FIG. 7, FIG. 8, and FIG. 9. FIG. 4 illustrates a second schematic diagram of a display device 100 provided by an embodiment of the present disclosure which is not bent. FIG. 5 illustrates a second schematic diagram of a display device 100 provided by an embodiment of the present disclosure which is bent. FIG. 6 illustrates a third schematic diagram of a display device 100 provided by an embodiment of the present disclosure which is bent. FIG. 7 illustrates a fourth schematic diagram of a display device 100 provided by an embodiment of the present disclosure which is bent. FIG. 8 illustrates a third schematic diagram of a display device 100 provided by an embodiment of the present disclosure which is not bent. FIG. 9 illustrates a fifth schematic diagram of a display device 100 provided by an embodiment of the present disclosure which is bent.

The embodiment of the present disclosure provides the display device 100. The display device 100 includes a display panel body 10, a back plate layer 11, and a rigid supporting layer 12. The display panel body 10 includes a flat plate part FF1, a bending part FF2, and a pad part FF3. The bending part FF2 is located between the flat plate part FF1 and the pad part FF2. When the bending part FF2 is bent, the pad part FF3 is located at a back side of the flat pate part FF1. The back plate layer 11 includes a first back plate 111. The first back plate 111 is arranged at the back side of the flat plate part FF1. The rigid supporting layer 12 is arranged between the first back plate 111 and the pad part FF3. The back plate layer 11 is black light-shielding material, and the first back plate 111 and the rigid supporting layer 12 are directly attached.

Specifically, the display device 100 does not include the second back plate 112. Compared with the first embodiment, a thickness of the display device 100 can be further reduced.

In some embodiments, the rigid supporting layer 12 is directly attached to the pad part FF3.

Specifically, the display device 100 does not include the second back plate 112, and the rigid supporting layer 12 is directly attached to a side of the pad part FF3 toward the flat plate part FF1 through a double-sided tape 31. That is, no other layer structure is arranged between the rigid supporting layer 12 and the pad part FF3, and the display device 100 can have a smallest thickness accordingly.

In some embodiments, the display device 100 further includes a first gel layer 17 and a second gel layer 18. The second gel layer 18 includes a first sub-gel member 181. An elastic modulus of the second gel layer 18 is greater than an elastic modulus of the first gel layer. The second gel layer 18 is arranged on a surface of the display panel body 10. The first gel layer 17 is arranged at an outer side of the bending part FF2. The first back plate 111 includes a first edge 201 toward the bending part FF2. The rigid supporting layer 12 includes a second edge 202 toward the bending part FF2. An orthographic projection of the first sub-gel member 181 on the display panel body 10 covers an orthographic projection of the first edge 201 on the display panel body 10.

Specifically, as shown in FIG. 4, FIG. 5, FIG. 6, FIG. 7, FIG. 8, and FIG. 9, the display device 100 does not include the second back plate 112, and the thickness of the display device 100 can be further reduced.

Specifically, compared FIG. 3 with FIG. 5, the display device 100 does not include the second back plate 112, and the thickness of the display device 100 is further reduced. When the bending part FF2 is bent, it is very easy to cause the bending part FF2 of the display panel body 10 to intersect with the flat plate part FF1 or to be bent with an adjacent part. The second gel layer 18 is arranged to protect the a part where the bending part FF2 and the flat plate part FF1 intersect or the adjacent part, thereby avoiding that the part is bent or bent excessively to prevent wires and electrodes at this part from being broken.

Specifically, the part where the second gel layer 18 is arranged on the display panel body 10 is reinforced and strengthened. This compensates for the unfavorable factors that the wirings and the electrodes might be broken caused by removal of the buffer and light-shielding layer and the second back plate 112, and thus the thickness of the display device 100 is reduced significantly.

Specifically, the first back plate 111 includes the first edge 201 toward the bending part FF2, and the rigid supporting layer 12 includes the second edge 202 toward the bending part FF2. That is, an edge of the first back plate 111 close to the bending part FF2 is the first edge 201, and an edge of the rigid supporting layer 12 close to the bending part FF2 is the second edge 202.

Specifically, the elastic modulus of the second gel layer 18 is greater than the elastic modulus of the first gel layer 17. The second gel layer 18 is arranged on the surface of the display panel body 10. The orthographic projection of the first sub-gel member 181 on the display panel body 10 covers the orthographic projection of the first edge 201 or the second edge 202 on the display panel body 10. The elastic modulus of the first gel layer 17 is relatively small to protect the bending part FF2 and is easy to be bent accordingly. The elastic modulus of the second gel layer 18 is relatively large to cause the first back plate 111 and the display panel body 10 not to be easily peeled off due to external force, and to prevent the wirings and the electrodes of the display panel body 10 corresponding to the first edge 201 from being broken. For example, when the bending part FF2 is bent or when the bending part FF2 is squeezed by external force, the bending part FF2 easily drives a part of the display panel body 10 corresponding to the first edge 201 to be deformed. The arrangement of the first sub-gel member 181 strengthens the strength of the part of the display panel body 10 to prevent the part of the display panel body 10 corresponding to the first edge 201 from being bent or deformed, thereby preventing the wiring and the electrodes at this part from being broken.

Specifically, the second gel layer 18 is arranged on the surface of the display panel body 10, the second gel layer 18 is arranged on a surface of the display panel body away from the back plate layer 11, or the second gel layer 18 is arranged on a surface of the display panel body 10 close to the back plate layer 11 and is not limited herein.

In some embodiments, the second gel layer 18 further includes a second sub-gel member 182. The orthographic projection of the first gel member 181 on the display panel body 10 covers the orthographic projection of the first edge 201 on the display panel body 10. An orthographic projection of the second sub-gel member 182 on the display panel body 10 covers an orthographic projection of the second edge 202 on the display panel body 10.

Specifically, the orthographic projection of the first sub-gel member 181 on the display panel body 10 covers the orthographic projection of the first edge 201 on the display panel body 10, and the orthographic projection of the second sub-gel member 182 on the display panel body 10 covers the orthographic projection of the second edge 202 on the display panel body 10. The second sub-gel member 182 has the same function as the first sub-gel member 181. When being subjected to external force, the first back plate 111 and the display panel body 10 are not easily peeled off to protect the wirings and the electrodes at this part of the display panel body 10 from being broken. At the same time, when being subjected to external force, the rigid supporting layer 12 and the display panel body 10 are not easily peeled off to protect the wirings and the electrodes at this part of the display panel body 10 from being broken.

In some embodiments, a thickness of the first sub-gel member 181 and a thickness of the second sub-gel member 182 are both greater than a thickness of the first gel layer.

Specifically, the thickness of the first sub-gel member 181 and the thickness of the second sub-gel member 182 are greater than the thickness of the first gel layer. This can increase protective effect of the first edge 201 and the second edge 202.

Specifically, in some embodiments, only the thickness of the first sub-gel member 181 or the thickness of the second sub-gel member 182 is increased.

Third Embodiment

The present embodiment is the same as or similar to the second embodiment except that a position of the first sub-gel member 181 or the second sub-gel member 182 is further described.

In some embodiments, the first sub-gel member 181 and the second sub-gel member 182 are arranged on the surface of the display panel body 10 away from the first back plate 111.

Specifically, as shown in FIG. 4, FIG. 5, FIG. 6, and FIG. 7, the first sub-gel member 181 or/and the second sub-gel member 182 are arranged on the surface of the display panel body 10 away from the first back plate 111.

Specifically, the first sub-gel member 181 or/and the second sub-gel member 182 are arranged on the surface of the display panel body 10 away from the first back plate 111. The orthographic projection of the first sub-gel member 181 on the display panel body covers the orthographic projection of the first edge 201 on the display panel body 10. As such, when being subjected to external force, the first back plate 111 and the display panel body 10 are not easily peeled off to prevent the wirings and the electrodes at this part of the display panel body 10 from being broken. Alternatively, the orthographic projection of the second sub-gel member 182 on the display panel body 10 covers the orthographic projection of the second edge 202 on the display panel body 10. When being subjected to external force, the rigid supporting layer 12 and the display panel body 10 are not easily peeled off to protect the wirings and the electrodes at this part of the display panel body 10 from being broken.

In some embodiments, the display device 100 further includes a polarizer 13. The polarizer 13 is arranged at a display side of the flat plate part FF1 of the display panel body 10. A distance between the first sub-gel member 181 and an edge of the polarizer 13 is greater than 0 μm and less than or equal to 200 μm.

Specifically, since a part of the first sub-gel member 181 is located on the bending part FF2, the distance between the first sub-gel member 181 and the edge of the polarizer 13 is greater than 0 μm. That is, the first sub-gel member 181 does not contact the edge of the polarizer 13 to prevent that the first sub-gel member 181 drives the polarizer 13 to be deformed when the bending part FF2 is bent. As such, performance degradation of the display device 100 can be avoided, and reliability of the display device 100 can be improved.

Specifically, the distance between the first sub-gel member 181 and the edge of the polarizer 13 is less than or equal to 200 μm. The distance between the first sub-gel member 181 and the edge of the polarizer 13 should not be too large. When the distance between the first sub-gel member 181 and the edge of the polarizer 13 is too large, a distance between the edge of the polarizer 13 and the bending part FF2 is too large accordingly. This causes a width of the frame at this part of the display device 100 to be too large, and thus performance of the narrow frame of the display device 100 is reduced.

In some embodiments, the display device 100 further includes a driving chip 16 and a pad terminal 15 arranged on a surface of the pad part FF3 away from the rigid supporting layer 12. The driving chip 16 is electrically connected to the pad terminal 15, and the second sub-gel member 182 contacts the pad terminal 15.

Specifically, the second sub-gel member 182 can contact the pad terminal 15, so that moisture does not easily accumulate between the second sub-gel member 182 and the pad terminal 15, and the second sub-gel member 182 can protect the pad terminal 15.

Fourth Embodiment

The present embodiment is the same as or similar to the second embodiment except that a position of the first sub-gel member 181 or the second sub-gel member 182 is further described.

In some embodiments, the first sub-gel member 181 and the second sub-gel member 182 are arranged on a surface of the display panel body 10 close to the first back plate 111, the first sub-gel member 181 contacts a side edge of the first back plate 111, and the second sub-gel member 182 contacts a side edge of the rigid supporting layer 12.

Specifically, as shown in FIG. 8 and FIG. 9, the first sub-gel member 181 or/and the second sub-gel member 182 are arranged on the surface of the display panel body 10 close to the first back plate 111.

Specifically, the first sub-gel member 181 contacts the side edge of the first back plate 111. The first sub-gel member 181 can prevent the wirings and the electrodes at a part of the display panel body 10 corresponding to the first edge 201 from being broken. For example, when the bending part FF2 is bent or when the bending part FF2 is squeezed by external force, the bending part FF2 easily drives the part of the display panel body 10 corresponding to the first edge 201 to be deformed. The arrangement of the first sub-gel member 181 blocks the part of the display panel body 10 from being bent to prevent the part of the display panel body 10 corresponding to the first edge 201 from being bent or deformed, thereby preventing the wiring and the electrodes at the part from being broken.

Specifically, the second sub-gel member 182 contacts the side edge of the rigid supporting layer 12. The second sub-gel member 182 can protect the wirings and the electrodes at a part of the display panel body 10 corresponding to the second edge 202 from being broken. For example, when the bending part FF2 is bent or when the bending part FF2 is squeezed by external force, the bending part FF2 easily drives the part of the display panel body 10 corresponding to the second edge 202 to be deformed. The arrangement of the second sub-gel member 182 blocks the part of the display panel body 10 from being bent to prevent the part of the display panel body 10 corresponding to the second edge 202 from being bent or deformed, thereby preventing the wiring and the electrodes at the part from being broken.

Fifth Embodiment

The present embodiment is the same as or similar to the second embodiment, the third embodiment, and the fourth embodiment except that that the second gel layer 18 is arranged in a different manner, and an elastic modulus of the second gel layer 18 is equal to an elastic modulus of the first gel layer 17.

Figure 10:
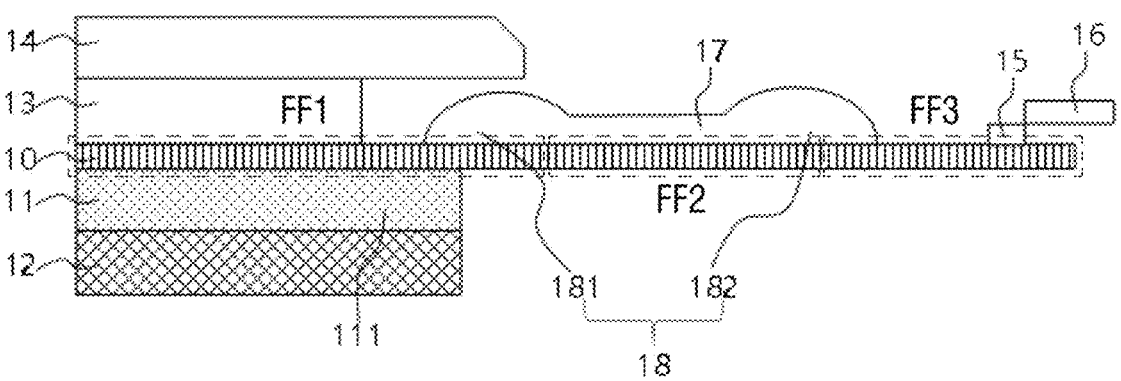
FIG. 10 illustrates a fourth schematic diagram of a display device provided by an embodiment of the present disclosure which is not bent.
Figure 11:
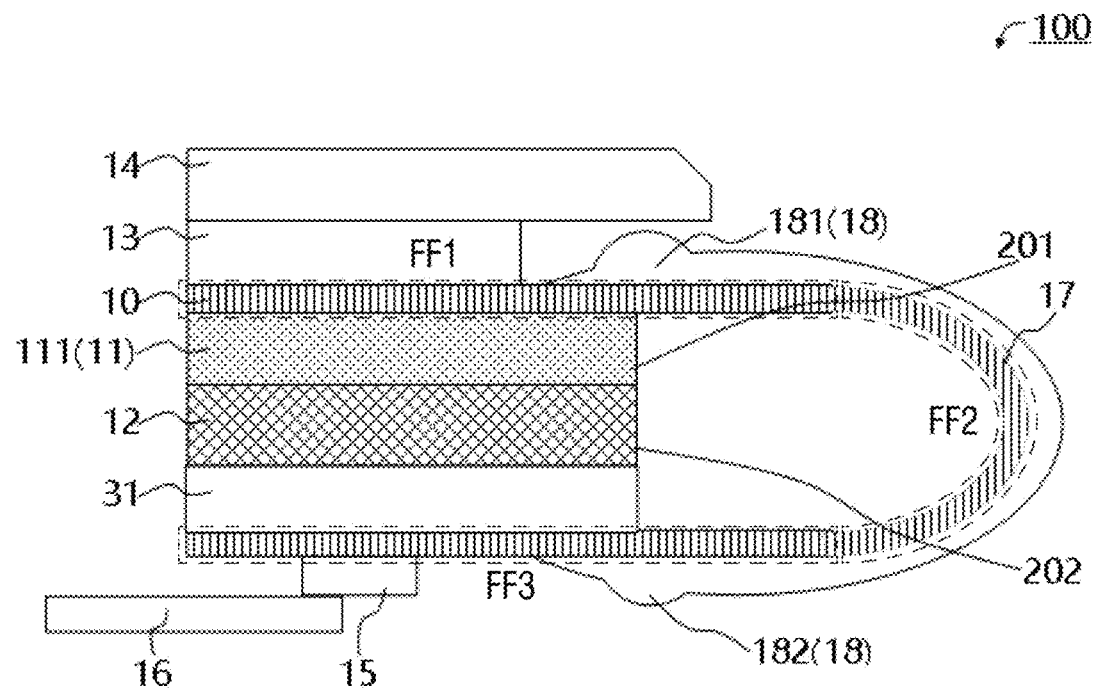
FIG. 11 illustrates a sixth schematic diagram of a display device provided by an embodiment of the present disclosure which is bent.
Figure 12:
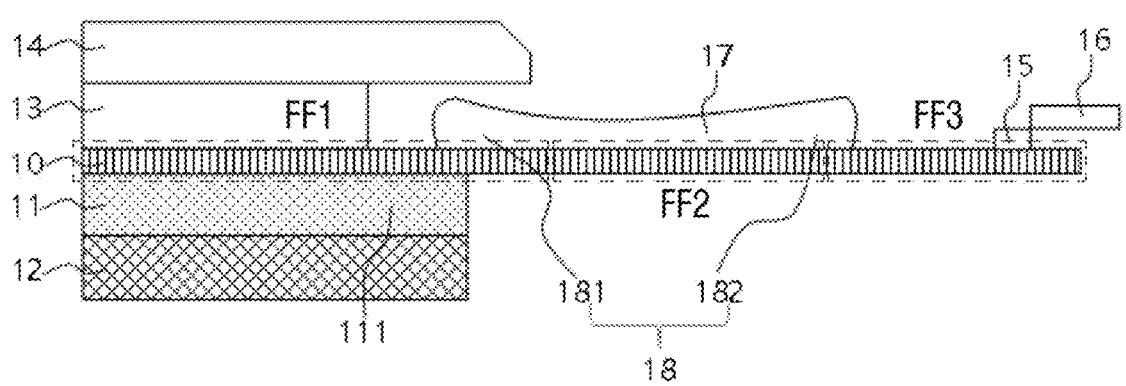
FIG. 12 illustrates a fifth schematic diagram of a display device provided by an embodiment of the present disclosure which is not bent.

Please refer to FIG. 10, FIG. 11, and FIG. 12. FIG. 10 illustrates a fourth schematic diagram of a display device 100 provided by an embodiment of the present disclosure which is not bent. FIG. 11 illustrates a sixth schematic diagram of a display device 100 provided by an embodiment of the present disclosure which is bent. FIG. 12 illustrates a fifth schematic diagram of a display device 100 provided by an embodiment of the present disclosure which is not bent.

In some embodiments, the display device 100 further includes a first gel layer 17 and a second gel layer 18. The second gel layer 18 includes a first sub-gel member 181. A thickness of the first sub-gel member 181 is greater than a thickness of the first gel layer. 17. The elastic modulus of the second gel layer 18 is equal to the elastic modulus of the first gel layer 17. The second gel layer 18 is arranged on a surface of the display panel body 10. The first gel layer 17 is arranged at an outer side of the bending part. The first back plate 111 includes a first edge 201 toward the bending part FF2. The rigid supporting layer 12 includes a second edge 202 toward the bending part FF2. An orthographic projection of the first sub-gel member 181 on the display panel body 10 covers an orthographic projection of the first edge 201 or the second edge 202 on the display panel body 10.

Specifically, the elastic modulus of the second gel layer 18 is equal to the elastic modulus of the first gel layer 17. The second gel layer 18 is arranged on the surface of the display panel body 10. The thickness of the first sub-gel 181 is greater than the thickness of the first gel layer 17. That is, the thickness of the first sub-gel member 181 is increased to improve protection of the first edge 201 or/and the second edge 202 in contact with the display panel body 10. Accordingly, the first back plate 111 and the display panel body 10 are not easily peeled off when subjected to external force, or the rigid supporting layer 12 and the display panel body 10 are not easily peeled off when subjected to external force, thereby preventing the wires and the electrodes at this part of the display panel body 10 from being broken.

In some embodiments, the second gel layer 18 further includes a second sub-gel member 182. A thickness of the second sub-gel member 182 is greater than the thickness of the first gel layer 17. The orthographic projection of the first sub-gel member on the display panel body 10 covers the orthographic projection of the first edge 201 on the display panel body 10, and an orthographic projection of the second sub-gel member 182 on the display panel body 10 covers the orthographic projection of the second edge 202 on the display panel body 10.

Specifically, arranging the first sub-gel member 181 and the second sub-gel member 182 which are thickened can protect the parts corresponding of the first edge 201 and the second edge 202 at the same time.

Specifically, the elastic modulus of the second gel layer 18 is equal to the elastic modulus of the first gel layer 17. This means that the second gel layer 18 and the first gel layer 17 are made of the same material.

Further, in some embodiments, the first sub-gel member 181 and the second sub-gel member 182 are connected to each other to be an integral structure.

Specifically, as shown in FIG. 10, the first gel layer 17 and the second gel layer 18 are formed at the same time by the same process, such as a coating process or a spraying process, so that the first sub-gel member 181, the first gel layer 17, and the second sub-gel member 182 are sequentially connected to be an integral structure. Forming the first gel layer 17 and the second gel layer 18 at the same time can simplify a manufacturing process and can complete protection of various parts.

Further, in some embodiments, the thickness of the first sub-gel member 181 gradually decreases toward the first gel layer 17, and the thickness of the second sub-gel member 182 gradually decreases toward the first gel layer 17.

Specifically, each of the first sub-gel member 181 and the second sub-gel member 182 has a thicker thickness, and the first gel layer 17 has a smaller thickness. The thickness of the first sub-gel member 181 gradually decreases toward the first gel layer 17, and the thickness of the second sub-gel member 182 gradually decreases toward the first gel layer 17. This can better meet performance of requirements of the display panel body 10 in some situations. For example, a bending angle at a center of the bending part FF2 is largest, and thus the first gel layer 17 with a relatively smaller thickness is required. The parts corresponding to the first sub-gel member 181 and the second sub-gel member 182 are most likely to be peeled off, and thus each of them with a relatively larger thickness is required.

In some embodiments, the display device 100 further includes a polarizer 13. The polarizer 13 is arranged on a display side of the flat plate part FF1 of the display panel body 10. A distance between the first sub-gel member 181 and an edge of the polarizer 13 is greater than 0 μm and less than or equal to 200 μm.

Specifically, since a part of the first sub-gel member 181 is located on the bending part FF2, the distance between the first sub-gel member 181 and the edge of the polarizer 13 is greater than 0 μm. That is, the first sub-gel member 181 does not contact the edge of the polarizer 13 to prevent that the first sub-gel member 181 drives the polarizer 13 to be deformed when the bending part FF2 is bent. As such, performance degradation of the display device 100 can be avoided, and reliability of the display device 100 can be improved.

Specifically, the distance between the first sub-gel member 181 and the edge of the polarizer 13 is less than or equal to 200 μm. The distance between the first sub-gel member 181 and the edge of the polarizer 13 should not be too large. When the distance between the first sub-gel member 181 and the edge of the polarizer 13 is too large, a distance between the edge of the polarizer 13 and the bending part FF2 is too large accordingly. This causes a width of the frame at this part of the display device 100 to be too large, and thus performance of the narrow frame of the display device 100 is reduced.

In some embodiments, the display device 100 further includes a driving chip 16 and a pad terminal 15 arranged on a surface of the pad part FF3 away from the rigid supporting layer 12. The driving chip 16 is electrically connected to the pad terminal 15, and the second sub-gel member 182 contacts the pad terminal 15.

Specifically, the second sub-gel member 182 can contact the pad terminal 15, so that moisture does not easily accumulate between the second sub-gel member 182 and the pad terminal 15, and the second sub-gel member 182 can protect the pad terminal 15.

It should be noted that in the second embodiment, the third embodiment, the fourth embodiment, and the fifth embodiment, the second back plate 112 can also be arranged in the display device 100. That is, the second gel layer 18 can also be arranged in the first embodiment, and a part where the second gel layer 18 is arranged on the display panel body 10 is reinforced and strengthened. This compensates for the unfavorable factors that the wirings and the electrodes might be broken caused by removal of the buffer and light-shielding layer, and thus the thickness of the display device 100 is reduced significantly when compared with the prior art.

Sixth Embodiment

Figure 13:
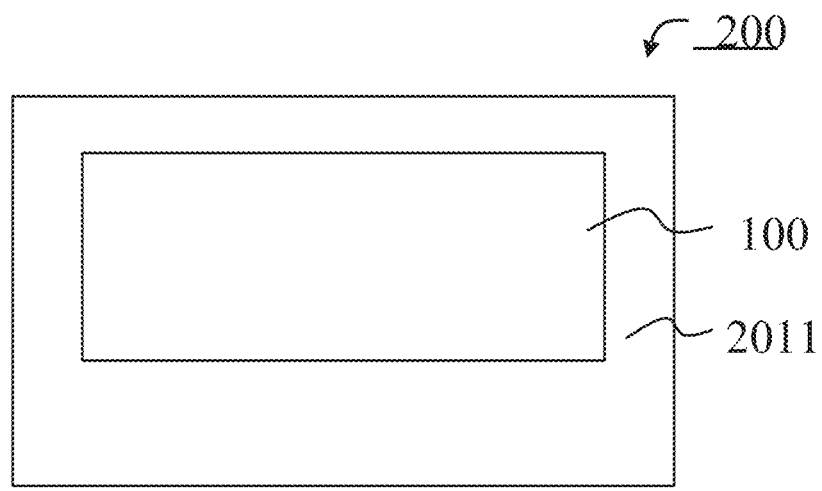
FIG. 13 illustrates a schematic diagram of a display terminal according to an embodiment of the present disclosure.

Please refer to FIG. 13. FIG. 13 illustrates a schematic diagram of a display terminal according to an embodiment of the present disclosure.

An embodiment of the present disclosure further provides a display terminal 200. The display terminal 200 includes the display device 100 in any one of the above-mentioned embodiments, and further includes a driving chip and a circuit board (not shown) which are electrically connected to the bending part FF22 of the display panel body 10. Specifically, the driving chip and the circuit board are electrically connected to the pad terminal on the binding part FF3.

The embodiment of the present disclosure further provides the display terminal 200. The display terminal 200 includes a terminal body 2011 and the display device 100 in any one of the above-mentioned embodiments. The terminal body 2011 and the display device 100 are combined as one.

Specifically, the display terminal 200 can be a mobile phone, a television, a notebook computer or the like.

The display device and the display terminal provided by the embodiments of the present disclosure are described in detail above. Although the principles and implementations of the present disclosure are described by using specific examples in this specification, the above-mentioned description of the embodiments is only intended to help understand the method and the core idea of the present disclosure. Moreover, those skilled in the art can make modifications to the specific implementations and an application range according to the idea of the present disclosure. In conclusion, the content of the specification is not intended to be construed as a limitation on the present disclosure.

What is claimed is:

1. A display device, comprising:
   a display panel body comprising a flat plate part, a bending part, and a pad part, wherein the bending part is located between the flat plate part and the pad part; and the bending part is bendable, and when the bending part is bent, the pad part is located at a back side of the flat plate part;
   a back plate layer comprising a first back plate, wherein the first back plate is arranged at the back side of the flat plate part; and
   a rigid supporting layer arranged between the first back plate and the pad part;
   wherein the back plate layer is made of black light-shielding material, and the first back plate is directly attached to the rigid supporting layer;
   wherein the display device further comprises a first gel layer and a second gel layer, wherein the second gel layer comprises a first sub-gel member, an elastic modulus of the second gel layer is greater than an elastic modulus of the first gel layer, and the second gel layer is arranged on a surface of the display panel body;
   the first gel layer is arranged at an outer side of the bending part, the first back plate comprises a first edge toward the bending part, the rigid supporting layer comprises a second edge toward the bending part, and an orthographic projection of the first sub-gel member on the display panel body covers an orthographic projection of the first edge or the second edge on the display panel body; and
   wherein the rigid supporting layer is directly attached to the pad part.

2. The display device of claim 1, wherein the back plate layer further comprises a second back plate, and the second back plate is arranged at a side of the pad part toward the flat plate part.

3. The display device of claim 1, wherein the back plate layer comprises at least one of polyimide and ethylene terephthalate, and the at least one of the polyimide and the ethylene terephthalate is doped with black material.

4. The display device of claim 1, wherein the second gel layer further comprises a second sub-gel member; and
   the orthographic projection of the first sub-gel member on the display panel body covers the orthographic projection of the first edge on the display panel body, and the orthographic projection of the second sub-gel member on the display panel body covers the orthographic projection of the second edge on the display panel body.

5. The display device of claim 4, wherein a thickness of the first sub-gel member and a thickness of the second sub-gel member are both greater than a thickness of the first gel layer.

6. The display device of claim 4, wherein each of the first sub-gel member and the second sub-gel member is arranged on a surface of the display panel body away from the first back plate.

7. The display device of claim 6, further comprising a polarizer, wherein the polarizer is arranged at a display side of the flat plate part of the display panel body, and a distance between the first sub-gel member and an edge of the polarizer is greater than 0 μm and less than or equal to 200 μm;
   wherein the display side refers to a side where an image is displayed or viewed by human eyes, and the display side of the flat plate part refers to a side of the flat plate part away from the back plate layer.

8. The display device of claim 7, further comprising a driving chip and a pad terminal arranged on a surface of the pad part away from the rigid supporting layer, the driving chip is electrically connected to the pad terminal, and the second sub-gel member contacts the pad terminal.

9. The display device of claim 4, wherein the first sub-gel member and the second sub-gel member are arranged on a surface of the display panel body close to the first back plate, the first sub-gel member contacts a side edge of the first back plate, and the second sub-gel member contacts a side edge of the rigid supporting layer.

10. A display terminal, comprising a terminal body and a display device, wherein the terminal body and the display device are combined as one, and the display device comprises:
    a display panel body comprising a flat plate part, a bending part, and a pad part, wherein the bending part is located between the flat plate part and the pad part; and the bending part is bendable, and when the bending part is bent, the pad part is located at a back side of the flat plate part;
    a back plate layer comprising a first back plate, wherein the first back plate is arranged at the back side of the flat plate part; and
    a rigid supporting layer arranged between the first back plate and the pad part;
    wherein the back plate layer is made of black light-shielding material, and the first back plate is directly attached to the rigid supporting layer;
    wherein the display terminal further comprises further comprises a first gel layer and a second gel layer, wherein the second gel layer comprises a first sub-gel member, an elastic modulus of the second gel layer is greater than an elastic modulus of the first gel layer, and the second gel layer is arranged on a surface of the display panel body;
    the first gel layer is arranged at an outer side of the bending part, the first back plate comprises a first edge toward the bending part, the rigid supporting layer comprises a second edge toward the bending part, and an orthographic projection of the first sub-gel member on the display panel body covers an orthographic projection of the first edge or the second edge on the display panel body; and
    wherein the rigid supporting layer is directly attached to the pad part.

11. The display terminal of claim 10, wherein the back plate layer further comprises a second back plate, and the second back plate is arranged at a side of the pad part toward the flat plate part.

12. A display device, comprising:
    a display panel body comprising a flat plate part, a bending part, and a pad part, wherein the bending part is located between the flat plate part and the pad part; and the bending part is bendable, and when the bending part is bent, the pad part is located at a back side of the flat plate part;

a back plate layer comprising a first back plate, wherein the first back plate is arranged at the back side of the flat plate part; and a rigid supporting layer arranged between the first back plate and the pad part;

wherein the back plate layer is made of black light-shielding material, and the first back plate is directly attached to the rigid supporting layer;

wherein the display device further comprises a first gel layer and a second gel layer, wherein the second gel layer comprises a first sub-gel member, a thickness of the first sub-gel member is greater than a thickness of the first gel layer, an elastic modulus of the second gel layer is equal to an elastic modulus of the first gel layer, and the second gel layer is arranged on a surface of the display panel body;

the first gel layer is arranged at an outer side of the bending part, the first back plate comprises a first edge toward the bending part, the rigid supporting layer comprises a second edge toward the bending part, and an orthographic projection of the first sub-gel member on the display panel body covers an orthographic projection of the first edge or the second edge on the display panel body; and wherein the rigid supporting layer is directly attached to the pad part.

13. The display device of claim 12, wherein the second gel layer further comprising a second sub-gel member, and a thickness of the second sub-gel member is greater than the thickness of the first gel layer; and the orthographic projection of the first sub-gel member on the display panel body covers the orthographic projection of the first edge on the display panel body, and an orthographic projection of the second sub-gel member on the display panel body covers the orthographic projection of the second edge on the display panel body.

14. The display device of claim 13, wherein the first sub-gel member and the second sub-gel member are connected to each other to be a unitary structure.

15. The display device of claim 14, wherein the thickness of the first sub-gel member gradually decreases toward the first gel layer, and the thickness of the second sub-gel member gradually decreases toward the first gel layer.

16. The display device of claim 14, further comprising a polarizer, wherein the polarizer is arranged at a display side of the flat plate part of the display panel body, and a distance between the first sub-gel member and an edge of the polarizer is greater than 0 μm and less than or equal to 200 μm;

wherein the display side refers to a side where an image is displayed or viewed by human eyes, and the display side of the flat plate part refers to a side of the flat plate part away from the back plate layer.

17. The display device of claim 16, further comprising a driving chip and a pad terminal arranged on a surface of the pad part away from the rigid supporting layer, the driving chip is electrically connected to the pad terminal, and the second sub-gel member contacts the pad terminal.

\* \* \* \* \*